(12) United States Patent
Neal et al.

(10) Patent No.: US 11,594,463 B2
(45) Date of Patent: Feb. 28, 2023

(54) SUBSTRATE THERMAL LAYER FOR HEAT SPREADER CONNECTION

(71) Applicant: Intel Corporation, Santa Clara, CA (US)

(72) Inventors: Nicholas Neal, Gilbert, AZ (US); Nicholas Haehn, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 993 days.

(21) Appl. No.: 16/158,191

(22) Filed: Oct. 11, 2018

(65) Prior Publication Data

US 2020/0118902 A1    Apr. 16, 2020

(51) Int. Cl.
  *H01L 23/00* (2006.01)
  *H01L 23/367* (2006.01)
  *H01L 23/532* (2006.01)

(52) U.S. Cl.
  CPC ...... *H01L 23/367* (2013.01); *H01L 23/53233* (2013.01); *H01L 24/17* (2013.01)

(58) Field of Classification Search
  CPC .. H01L 23/367; H01L 23/53233; H01L 24/17
  See application file for complete search history.

(56) References Cited

U.S. PATENT DOCUMENTS

| | | | | |
|---|---|---|---|---|
| 8,901,748 B2* | 12/2014 | Manusharow | ...... | H01L 23/5385 257/652 |
| 8,963,317 B2* | 2/2015 | Lin | ...... | H01L 21/486 257/691 |
| 10,199,356 B2* | 2/2019 | Kinsley | ...... | H01L 23/36 |
| 2007/0045819 A1* | 3/2007 | Edwards | ...... | H01L 23/10 257/E23.087 |
| 2008/0237841 A1* | 10/2008 | Arana | ...... | H01L 23/433 257/E23.11 |
| 2009/0219698 A1* | 9/2009 | Chao | ...... | H01L 25/0655 165/185 |
| 2010/0230805 A1* | 9/2010 | Refai-Ahmed | ...... | H01L 23/36 438/107 |
| 2011/0278715 A1* | 11/2011 | Ihara | ...... | H01L 24/82 257/E23.08 |
| 2012/0007229 A1* | 1/2012 | Bartley | ...... | H01L 23/3677 438/122 |
| 2012/0119346 A1* | 5/2012 | Im | ...... | H01L 21/563 257/E23.18 |
| 2012/0146207 A1* | 6/2012 | Chou | ...... | H01L 25/18 438/107 |
| 2013/0119528 A1* | 5/2013 | Groothuis | ...... | H01L 25/0657 257/777 |
| 2014/0040698 A1* | 2/2014 | Loh | ...... | G06F 11/1004 711/E12.001 |

(Continued)

*Primary Examiner* — Eugene Lee
(74) *Attorney, Agent, or Firm* — Schwabe, Williamson & Wyatt, P.C.

(57) ABSTRACT

A semiconductor device package structure is provided. The semiconductor device package structure includes a substrate having a first layer over a second layer. The first layer may have greater thermal conductivity than the second layer. The semiconductor device package structure further includes one or more dies coupled to the substrate. A heat spreader may have a first section coupled to a first surface of a first die of the one or more dies, and a second section coupled to the first layer.

17 Claims, 6 Drawing Sheets

(56) References Cited

U.S. PATENT DOCUMENTS

| | | | |
|---|---|---|---|
| 2014/0264820 A1* | 9/2014 | Hu | H01L 23/3736 |
| | | | 257/713 |
| 2014/0300004 A1* | 10/2014 | Choi | H01L 21/6835 |
| | | | 257/774 |
| 2015/0170989 A1* | 6/2015 | Dhavaleswarapu | |
| | | | H01L 23/3675 |
| | | | 438/122 |
| 2015/0255429 A1* | 9/2015 | Katkar | H01L 21/76898 |
| | | | 257/774 |
| 2015/0279431 A1* | 10/2015 | Li | H01L 25/0652 |
| | | | 438/109 |
| 2017/0170155 A1* | 6/2017 | Yu | H01L 25/50 |
| 2018/0190617 A1* | 7/2018 | Chew | H01L 25/50 |
| 2019/0067157 A1* | 2/2019 | Lin | H01L 25/0652 |
| 2019/0295952 A1* | 9/2019 | Sikka | H01L 23/5381 |
| 2020/0091034 A1* | 3/2020 | Shao | H01L 24/13 |

\* cited by examiner

SUBSTRATE THERMAL LAYER FOR HEAT SPREADER CONNECTION

BACKGROUND

Integrated Circuit (IC) semiconductor device packages are decreasing in size, while becoming more powerful. This has provided a thermal challenge. For example, removing heat from bottom surface of an IC die that is on a substrate can be challenging.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

In an example, in a semiconductor package, one or more Integrated Circuit (IC) dies may be coupled to a substrate. For example, a first or top surface of the dies may be facing away from the substrate, and a second or bottom surface of the dies may be facing towards the substrate. A heat spreader may be coupled to the top surface of the dies (e.g., by appropriate thermally conductive material or paste).

It may be a challenge to dissipate heat from the bottom surface of the dies (e.g., which is facing the substrate). In some embodiments, to alleviate such thermal issues, the substrate may have a top layer that includes thermally conductive material, e.g., metal (such as copper). The top layer may have openings, through which the dies may be electrically coupled to the substrate using electrical interconnect structures.

The heat spreader may also be coupled to the top layer of the substrate. For example, the coupling between the heat spreader and the top layer of the substrate may be along the sides of the dies (e.g., along a periphery of the package).

Also, in areas not populated by the electrical interconnect structures, the bottom surface of the dies may be coupled to the top layer of the substrate by thermal bumps. Thus, heat may be dissipated from the bottom surface of the dies through the thermal bumps, the top layer of the substrate, and eventually to the heat spreader. The heat spreader may have appropriate arrangement to dissipate the heat. Thus, the top surfaces of the dies may directly dissipate heat to the heat spreader, and the bottom surfaces of the die may dissipate heat to the heat spreader through the thermal bumps and the top layer of the substrate. This may result in better thermal management of the package, and prevent or reduce chances of local hotspots developing in the dies. Other technical effects will be evident from the various embodiments and figures.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or"

as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

FIGS. 1A, 1B, 1C, 1D, and 1E schematically illustrate a semiconductor device package 100 (also referred to as package 100) including an integrated heat spreader 106 that is coupled to one or more Integrated Circuit (IC) dies 104a, 104b, 104c, and also coupled to a substrate 101, according to some embodiments.

Elements referred to herein with a common reference label followed by a particular number, letter or alphabet may be collectively referred to by the reference label alone. For example, IC dies 104a, 104b, 104c may be collectively and generally referred to as IC dies 104 in plural, and IC die 104 in singular. Although three IC dies 104 (also referred to as dies 104) are illustrated in FIGS. 1A-1E, such a number of the dies 104 are merely examples, and the package 100 may include any appropriate number of dies 104.

Figure 1A:
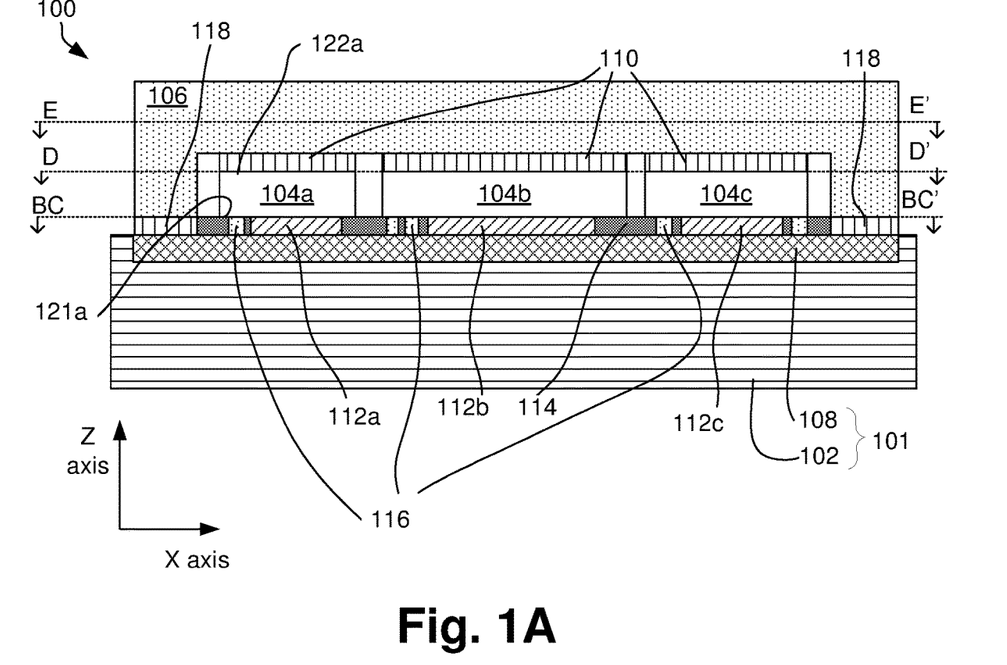
FIGS. 1A, 1B, 1C, 1D, and 1E schematically illustrate a semiconductor device package including an integrated heat spreader that is coupled to one or more Integrated Circuit (IC) dies, and also coupled to a substrate, according to some embodiments.

FIG. 1A is a cross sectional view of the package 100 (e.g., along X-Z axis), and FIGS. 1B-1E are top views of the package 100 (e.g., along X-y axis). For purposes of illustrative clarity, in FIGS. 1B-1E, some of the components of the package 100 are not illustrated.

Figure 1B:
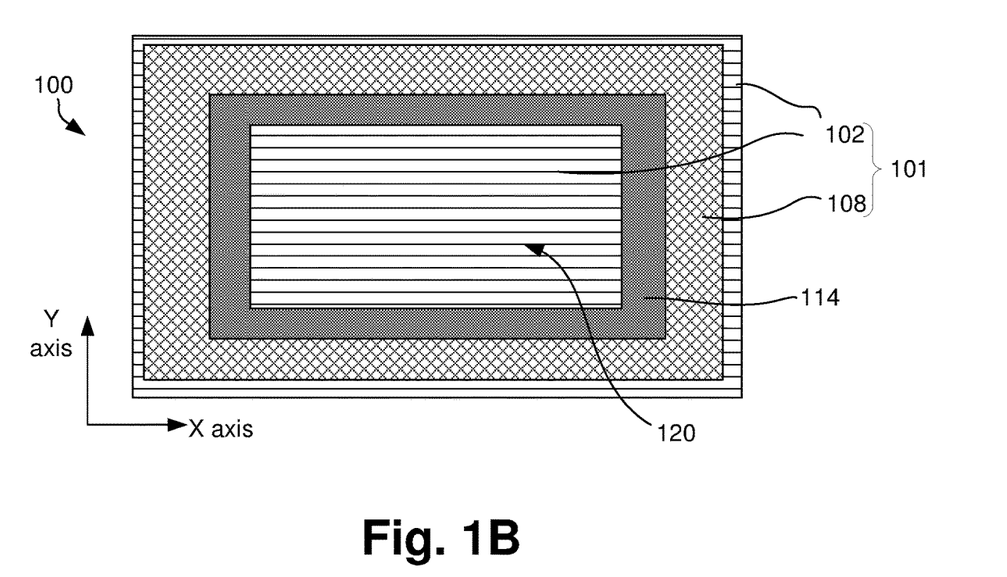
Figure 1C:
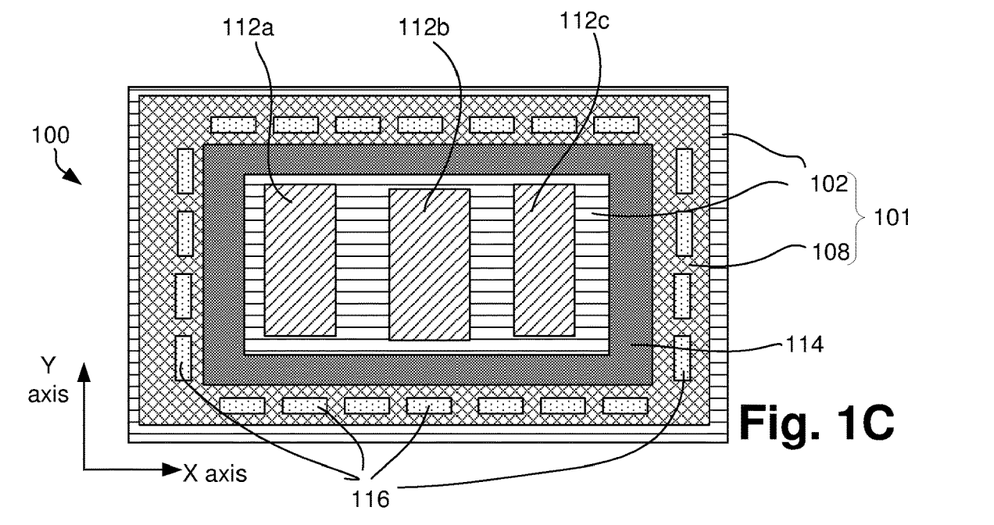

FIGS. 1B-1C are sectional views of the package 100 along a dotted line BC-BC' illustrated in FIG. 1A. FIG. 1B does not illustrate at least the dies 104, the heat spreader 106, interconnect structures 112, components 116, etc., although the interconnect structures 112 and components 116 would normally be visible in the sectional view along line BC-BC'. FIG. 1C illustrates the interconnect structures 112 and components 116, but does not illustrate the dies 104 and the heat spreader 106.

Figure 1D:
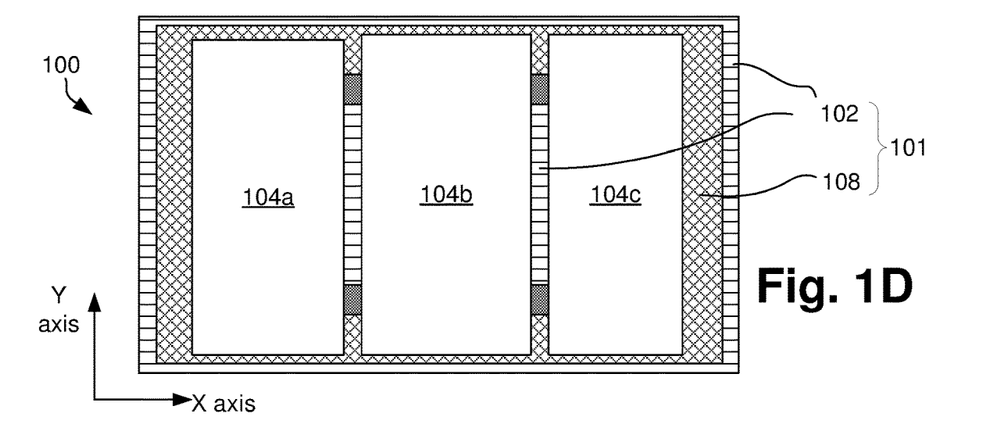
Figure 1E:
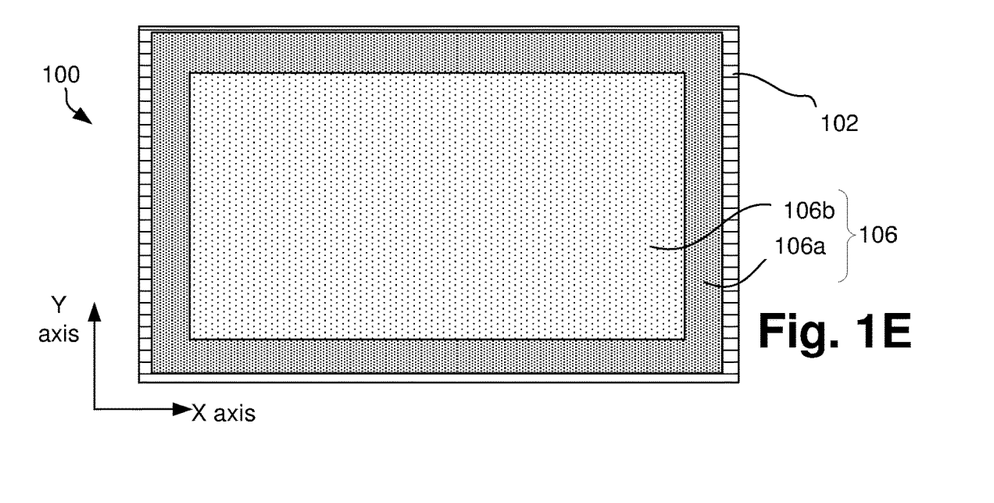

FIG. 1D is a sectional view of the package 100 along a dotted line D-D' illustrated in FIG. 1A. FIG. 1E is a sectional view of the package 100 along a dotted line E-E' illustrated in FIG. 1A. FIG. 1D does not illustrate at least the heat spreader 106. FIG. 1E illustrates the heat spreader, which covers the view of various components (e.g., including the dies 104, the layer 102, etc.) of the package 100.

In some embodiments, the substrate 100 includes layers 102 and 108. The layer 108 includes thermally conductive material, such as metal. Merely as an example, the layer 108 includes Copper, Tin, Aluminum, and/or any appropriate thermally conductive material. In an example, a thickness of the layer 108 may be between 10 microns to 120 microns. In an example, the layer 108 is a top layer of the substrate 101 (e.g., may be over the layer 102). In an example, a thermal conductivity of the layer 108 is substantially higher than that of the layer 102.

Although not illustrated in FIGS. 1A-1E, the layer 102 may include multiple layers of dielectric material, electrical interconnect structures, metal built-up layers, etc., and hence, layer 102 is also referred to herein as layers 102. For example, the thermal conductivity of the layer 108 is substantially higher than one or more dielectric layers of the layer 102.

In some embodiments, a substrate discussed herein (e.g., such as the substrate 101, or the layer 102 of the substrate 101) may be capable of providing electrical communications between an electrical component, such as one or more IC dies, and a next-level component to which an IC package may be coupled (e.g., a circuit board). In an example, a substrate may include any suitable type of substrate capable of providing electrical communication between an IC die and an upper IC package coupled with a lower IC/die package, and in a further example a substrate may comprise any suitable type of substrate capable of providing electrical communication between an upper IC package and a next-level component to which an IC package is coupled. A substrate may also provide structural support for a die. By way of example, in one embodiment, a substrate may include a multi-layer substrate—including alternating layers of a dielectric material and metal built-up around a core layer (either a dielectric or a metal core). In another embodiment, a substrate may be a coreless multi-layer substrate. Other types of substrates and substrate materials may also find use with the disclosed embodiments (e.g., ceramics, sapphire, glass, etc.). Further, according to one embodiment, a substrate may include alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases). In an example, a substrate is a cored or coreless package substrate, may include epoxy resins, FR4, one or more semiconductor interposers (e.g., silicon), etc.

Individual ones of the dies 104 has a first surface (e.g., which may be an active surface of the die 104) coupled to and facing the substrate 101, and a second surface opposite to the first surface. For example, the first or active surface of the die 104a is labelled as 121a, and the second surface of the die 104a is labelled as 122a.

As illustrated in FIG. 1B, the layer 108 includes one or more openings. For example, FIG. 1B merely illustrates one opening 120 in the layer 108, and the layer 102 is visible through the opening of the layer 108 in the top view of FIG. 1B. The dies 104 (e.g., the first surface or the active surface of the dies 104, such as the first surface 121a of the die 104a) are coupled to the substrate 101 (e.g., to the layer 102) through the opening 120.

For example, a plurality of (e.g., an array of) interconnect structures 112a couple the die 104a (e.g., the first surface 121a of the die 104a) to the layer 102 of the substrate 101, a plurality of (e.g., an array of) interconnect structures 112b couple the die 104b to the layer 102 of the substrate 101, and a plurality of (e.g., an array of) interconnect structures 112c couple the die 104c to the layer 102 of the substrate 101. For example, although not illustrated in FIGS. 1A-1E, the layer 102 may include multiple layers of dielectric material, electrical interconnect structures, metal built-up layers, etc. The interconnect structures 112 electrically couple the dies 104 to the electrical interconnect structures, metal built-up layers, etc. within the layer 102.

The interconnect structures 112a, 112b, 112c for example, are bumps, bump pads, metal pillars (e.g., copper pillars), balls formed using metals, alloys, solderable material, or the like. The interconnect structures 112a, 112b, 112c, for example, are solder formed using metals, alloys, solderable material, or the like. In some embodiments, layers 114 of solder resist material may selectively separate sections of the dies 104 from the substrate 101. A top view of example locations of the interconnect structures 112 are illustrated in FIG. 1C.

For purposes of illustrative clarity, multiple (e.g., an array of) interconnect structures 112a are symbolically illustrated using a single box with diagonal lines (e.g., individual ones of the interconnect structures 112a are separated using, for example, solder resist material, although such solder resist material is not illustrated in FIG. 1A). Similarly, multiple interconnect structures 112b (and also 112c) are symbolically illustrated using a corresponding box with diagonal lines.

As illustrated in FIG. 1D, the layer 108 is adjacent to one or more sides of the dies 104, e.g., is along all four sides of the dies 104. The layer 108 is adjacent to one or more sides of the interconnect structures 112, as illustrated in FIG. 1C.

In some embodiments, the package 100 includes a heat spreader 106. The heat spreader is coupled to the dies 104, as well as the substrate 101, and is also referred to as an Integrated Heat Spreader (IHS).

In some embodiments, a section of the heat spreader 106 is coupled to the second surfaces of the dies 104 (e.g., coupled to the second surface 122a of the die 104a). In the example of FIG. 1A, the section of the heat spreader 106 is coupled (e.g., attached) to the second surfaces of the dies 104 via thermally conductive material 110 (also referred to as material 110), such as Thermal Interface Material (TIM). The material 110 may include, merely as examples, heat spreader sealant, thermal grease or paste, thermal adhesive, thermally conductive pad, thermal tape, and/or any appropriate thermally conductive material.

As discussed herein previously, sections of the first surfaces of the dies 104 (e.g., first surface 121a of the die 104a) are coupled to the layer 102 using the interconnect structures 112. In some embodiments, other sections of the first surfaces of the dies 104 (e.g., first surface 121a of the die 104a) are coupled to the layer 108. For example, thermally conductive components 116 (also referred to as components 116) couple the first surfaces of the dies 104 to the layer 108. Merely as an example, the components 116 are thermal bumps. The components 116 include any appropriate thermally conductive material, such as metal (e.g., copper, tin, etc.). In an example, same material may be used for the layer 108 and components 116. Thermal conductivity of the components 116 may be higher than the layer 102 of the substrate 101. A top view of example locations of the components 116 are illustrated in FIG. 1C.

In an example, the layer 102 and/or the components 116 are at locations where the interconnect structures 112 are not populated, or need not populate. In an example, the components 116 are located along a periphery of the substrate 101. Although FIG. 1C illustrates example components 116, the locations and/or the number of components 116 are merely examples, and do not limit the scope of this disclosure. In an example, two or more of the components 116 may be combined.

In an example, the layer 102 and the components 116 may not be electrically coupled (e.g., are electrically isolated) to the dies 104 (e.g., not electrically coupled to transistors within the dies 104). Thus, the layer 102 and the components 116 may be electrically floating. In another example, the layer 102 and the components 116 may be used for grounding purposes in the package 100, and in such examples, the layer 102 and the components 116 may be electrically grounded.

In some embodiments, a section of the heat spreader 106 is coupled to the layer 108. In the example of FIG. 1A, the section of the heat spreader 106 is coupled (e.g., attached) to the layer 108 using thermally conductive adhesive material 118 (also referred to as material 118). The material 118 may be thermally conductive, and may have adhesive properties to attach the heat spreader 106 to the layer 102. For example, the material 118 may be higher thermal conductivity than the layer 102 of the substrate 101.

The material 118 may include, merely as examples, metals, alloys, solderable material, and/or the like. The material 118, for example, are solder formed using metals, alloys, solderable material, or the like. Thus, in the example where the material 118 are solder, the heat spreader 106 is soldered to the substrate 101 (e.g., soldered to the layer 108). In another example, the material 118 may be heat spreader sealant, thermal grease or paste, thermal adhesive, thermally conductive pad, thermal tape, and/or the like.

Thus, the heat spreader 106 is coupled (e.g., soldered, or otherwise attached, by material 118) to the layer 108 along the periphery of the package 200, e.g., as illustrated in FIG. 1E. For example, in the top view of FIG. 1E, the heat spreader 106 is illustrated to have two sections 106a and 106b. The section 106a is coupled (e.g., soldered, or otherwise attached, by material 118) to the layer 108. The section 106a may be coupled to the layer 108 along the periphery of the package 100, along at least one side of the package 100, or along two, three or four sides of the package 100. Thus, the section 106a may be coupled to the layer 108 along one or more sides of the dies 104.

The section 106b may be over the dies 104. Portions of the section 106b of the heat spreader 106 may be coupled to the top surface of the dies 104 (e.g., by the material 110).

When the package 100 is in operation, heat may be generated in the dies 104. The generated heat may escape to the heat spreader 106 from the second or top surfaces of the dies 104 (e.g., second surface 122a of the die 104a) via the material 110. The generated heat may also escape to the heat spreader 106 from the first or bottom surfaces of the dies 104 (e.g., first surface 121a of the die 104a) via the components 116, the layer 108, and the material 118. For example, as the components 116, the layer 108, and the material 118 are thermally conductive, they can dissipate the heat from the bottom surfaces of the dies 104 to the heat spreader 106. Thus, heat may be dissipated from both the top and bottom surfaces of the dies 104. This may increase the heat dissipation rate, and may result in better thermal management for the package 100.

In an example, a thickness of the layer 108 may be between 10 microns to 120 microns. In an example, a thickness of the layer 108 may be more than a thickness of the interconnect structures 112.

Merely as an example, if the layer 108 includes copper and has a thickness of about 20 microns (and assuming that the material 118 is solderable material and the heat spreader 106 is soldered to the layer 108), heat dissipation through the layer 108 may reduce the temperature of at least some sections of the die 104 by about 2.8 degree centigrade. Merely as an example, if the layer 108 include copper and has a thickness of about 100 microns (and assuming that the material 118 is solderable material and the heat spreader 106 is soldered to the layer 108), heat dissipation through the layer 108 may reduce the temperature of at least some sections of the die 104 by about 3.6 degree centigrade. Merely as an example, if the layer 108 includes copper and has a thickness of about 20 microns (and assuming that the material 118 is heat spreader sealant), heat dissipation through the layer 108 may reduce the temperature of at least some sections of the die 104 by about 2.1 degree centigrade. Merely as an example, if the layer 108 include copper and has a thickness of about 100 microns (and assuming that the material 118 is heat spreader sealant), heat dissipation through the layer 108 may reduce the temperature of at least some sections of the die 104 by about 2.2 degree centigrade.

Figure 2A:
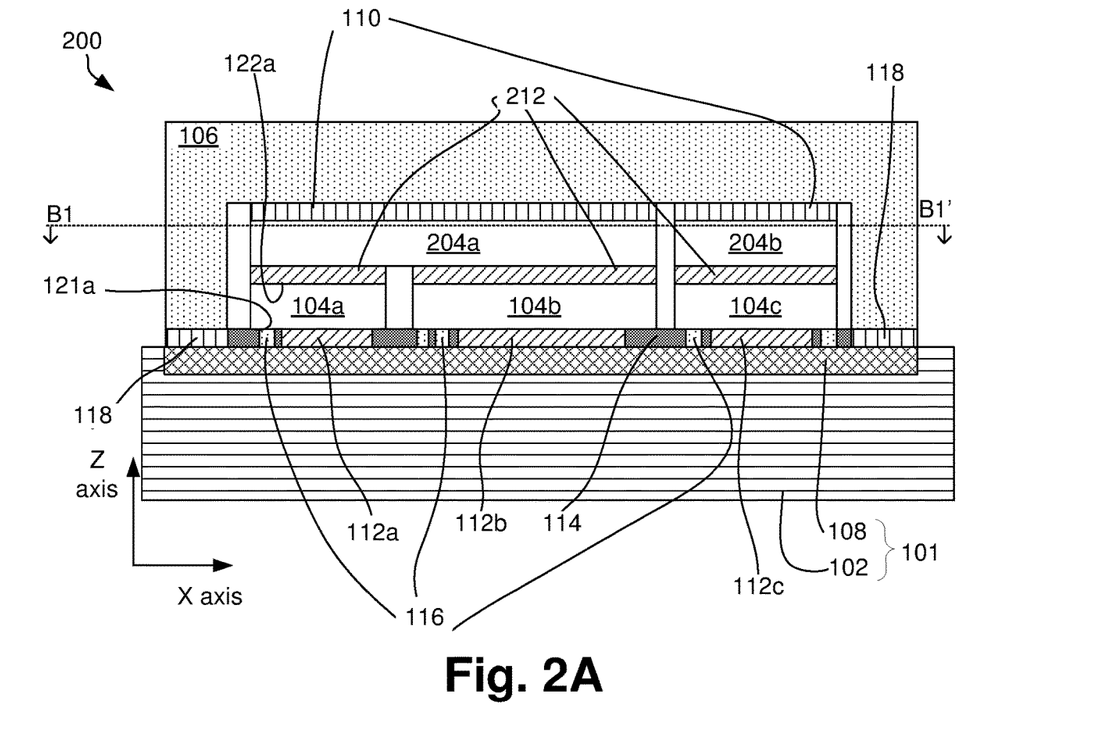
FIGS. 2A-2B schematically illustrate a semiconductor device package including an integrated heat spreader that is coupled to one or more IC dies and also coupled to a substrate, where one or more dies of the package are stacked, according to some embodiments.
Figure 2B:
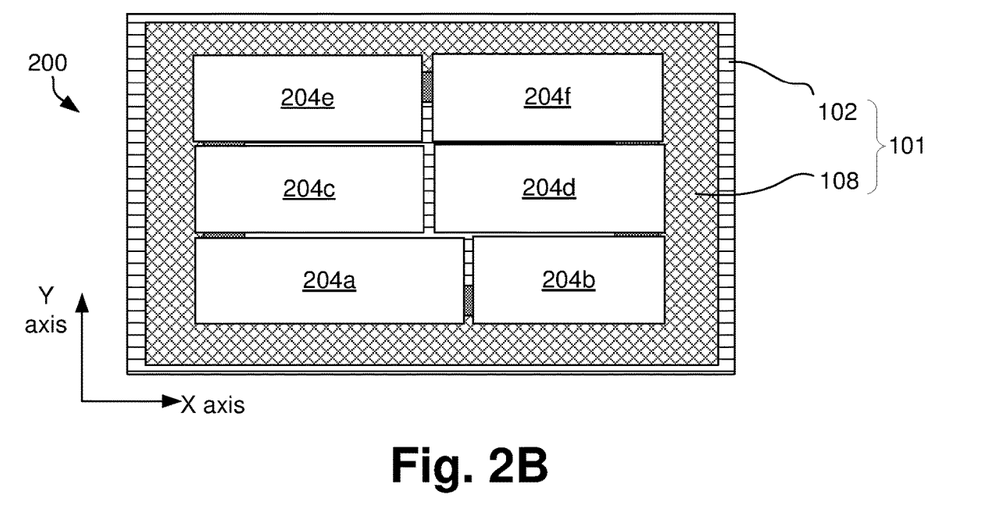

In FIGS. 1A-1D, the dies 104 are arranged on a side-by-side arrangement, e.g., each of the dies 104 are coupled to the substrate 101 using respectively components 116. However, the dies 104 can be arranged in any appropriate manner, e.g., may be stacked. FIG. 2A schematically illustrates a cross-sectional view of a semiconductor device package 200 (also referred to as package 200) including an integrated heat spreader 106 that is coupled to one or more IC dies 104a, 104b, 104c, 204, 204b and also coupled to the substrate 101, where one or more dies of the package 200 are stacked, according to some embodiments. FIG. 2B illustrates a top view of the package 200 (e.g., along X-Y axis) of FIG. 2A, according to some embodiments. For example, FIG. 2B is a sectional view of the package 200 along a dotted line B1-B1' illustrated in FIG. 2A.

The package 200 of FIG. 2A is at least in part similar to the package 100 of FIGS. 1A-1D, and similar components in the packages 100 and 200 are labelled using the same labels. For example, similar to the package 100, the package 200 includes the heat spreader 106, substrate 101 comprising the layers 102, 108, dies 104a, 104b, 104c, components 116, interconnect structures 112, material 118, etc.

The package 200 further includes dies 204a, 204b. The dies 204 are stacked over the dies 104. For example, the die 204a is stacked over the dies 104a, 104b (e.g., such that the dies 104a, 104b are between the die 204a and the substrate 101), and the die 204b is stacked over the die 104c. The manner of stacking the dies 104, 204 and/or the number of dies in the package 200 are merely examples, and do not limit the scope of this disclosure. In some embodiments, the die 204a is coupled to the dies 104a, 104b, and the die 204b is coupled to the die 104c using interconnect structures 212. In an example, the dies 104 include through silicon vias (although not illustrated in FIG. 2A), e.g., for electrically coupling the dies 204 to the substrate 101.

In some embodiments, the heat spreader 106 is coupled to the dies 204a, 204b using thermally conductive material 110. Although not illustrated in the cross-sectional view of FIG. 2A, the package 200 includes dies 204c, 204d, 204e, 204f, as illustrated in the top view of FIG. 2B. The dies 204c, . . . , 204f may be stacked on corresponding dies 104, although such corresponding dies are not illustrated in FIGS. 2A-2B.

In the package 200, heat from the dies 204 may dissipate to the heat spreader 106 through the thermally conductive material 110. Also, similar to the package 100, in the package 200, heat from the dies 104 may dissipate to the heat spreader 106 from the bottom surfaces of the dies 104 through the components 116, the layer 108, and the material 118.

Figure 3:
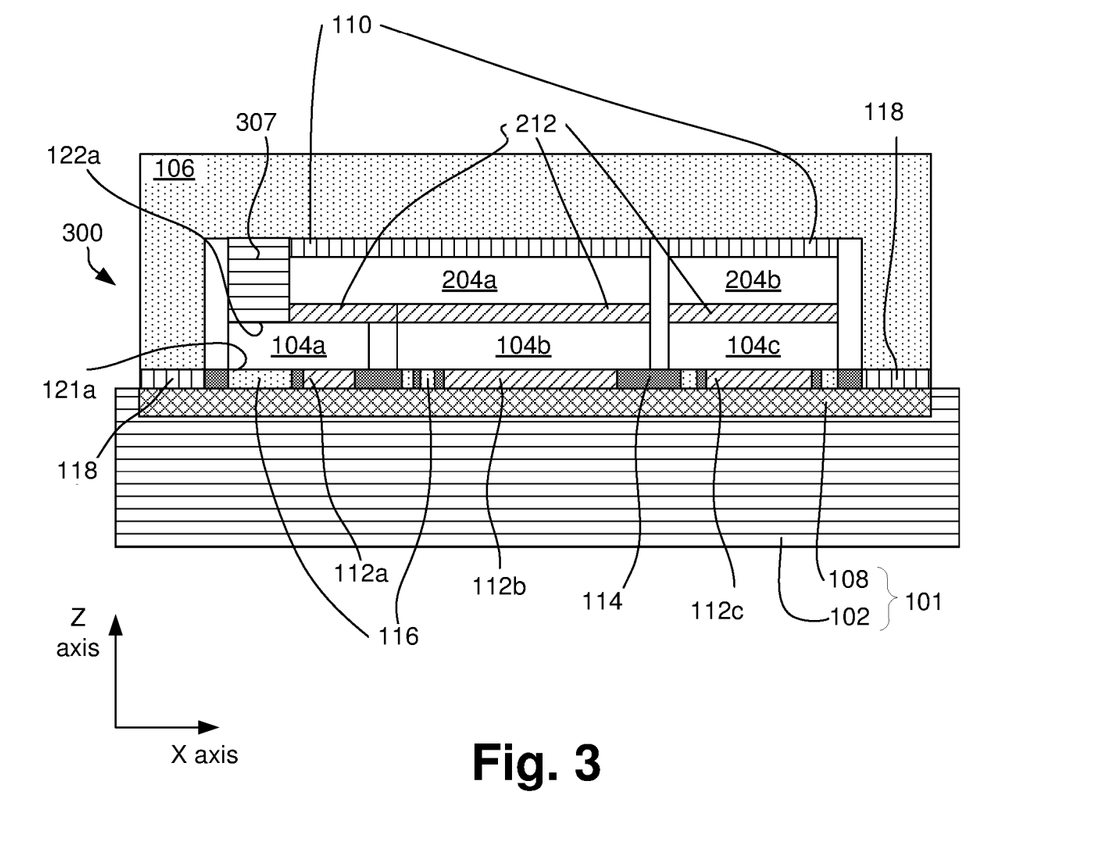
FIG. 3 schematically illustrates a semiconductor device package including an integrated heat spreader that is coupled to one or more IC dies and also coupled to a substrate, where one or more dies of the package are stacked, according to some embodiments.

FIG. 3 schematically illustrates a semiconductor device package 300 (also referred to as package 300) including an integrated heat spreader 106 that is coupled to one or more IC dies 104a, 104b, 104c, 204, 204b and also coupled to the substrate 101, where one or more dies of the package 200 are stacked, according to some embodiments. The package 300 of FIG. 3 is at least in part similar to the package 200 of FIGS. 2A-2B, and similar components in the packages 200 and 300 are labelled using the same labels. For example, similar to the package 200, the package 300 includes the heat spreader 106, substrate 101 comprising the layers 102, 108, dies 104a, 104b, 104c, 204a, 204b, components 116, interconnect structures 112, material 118, etc.

Additionally, in the package 300, layer 307 is between the die 104a and the heat spreader 106 (e.g., between a section of the top surface 122a of the die 104a and the heat spreader 106). The layer 307, in one example, includes dielectric material, such as molding compound. The layer 307, in another example, includes thermally conductive material, e.g., which may transfer heat from the top surface 122a of the die 104a to the heat spreader 106.

Figure 4:
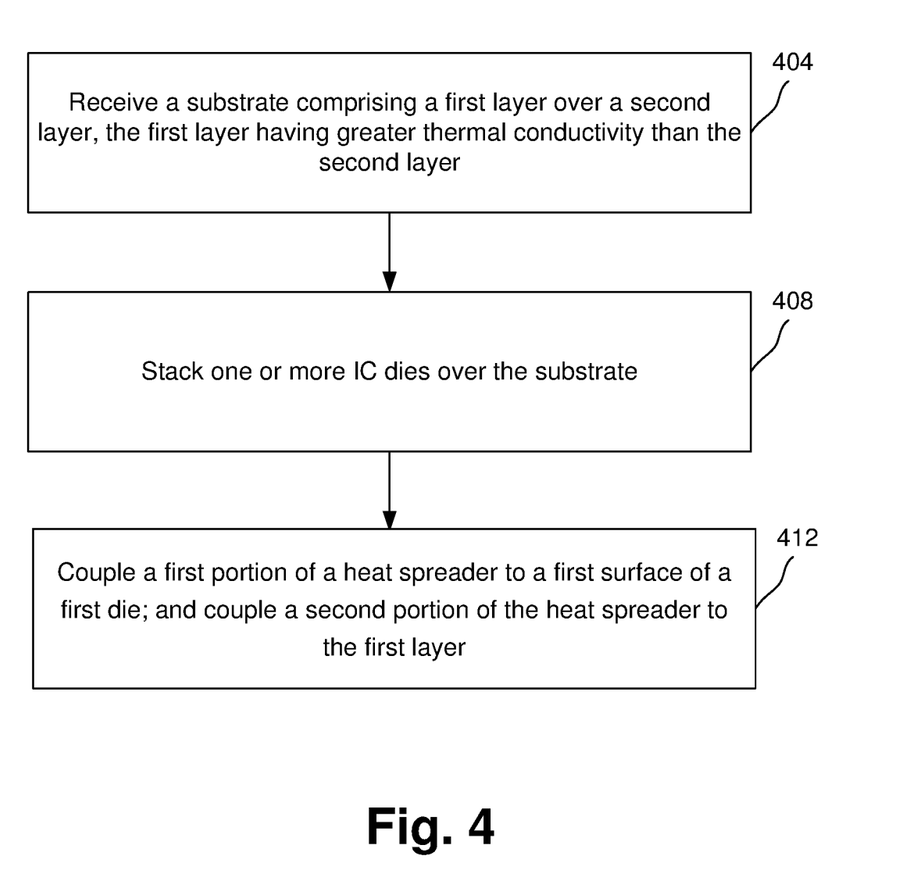
FIG. 4 illustrates a flowchart depicting a method for forming a semiconductor device package structure, where an integrated heat spreader of the semiconductor device package structure is coupled to one or more IC dies and also coupled to a substrate, according to some embodiments.

FIG. 4 illustrates a flowchart depicting a method 400 for forming a semiconductor device package structure (e.g., any of the packages 100, 200, or 300 discussed herein), where an integrated heat spreader of the semiconductor device package structure is coupled to one or more IC dies and also coupled to a substrate, according to some embodiments. Although the blocks in the flowchart with reference to FIG. 4 are shown in a particular order, the order of the actions can be modified. Thus, the illustrated embodiments can be performed in a different order, and some actions/blocks may be performed in parallel. Some of the blocks and/or operations listed in FIG. 4 may be optional in accordance with certain embodiments. The numbering of the blocks presented is for the sake of clarity and is not intended to prescribe an order of operations in which the various blocks must occur.

The method 400 includes, at 404, receiving a substrate (e.g., substrate 101) including a first layer (e.g., layer 108) over a second layer (e.g., layer 102). In some embodiments, the first layer has greater thermal conductivity than the second layer.

At 408, one or more dies (e.g., dies 104, 204) are stacked over the substrate. At 412, a first portion (e.g., section 106b of FIG. 1E) of a heat spreader (e.g., heat spreader 106) is coupled to a first surface of a first die, and a second portion (e.g., section 106a of FIG. 1E) of the heat spreader is coupled to the first layer. In some embodiments, the first layer has an opening, and the one or more dies are stacked over the substrate such that one or more interconnect structures are formed through the opening in the first layer to electrically couple the one or more dies to the substrate. In some embodiments, the first die is coupled to the first layer by one or more thermal bumps (e.g., the components 116).

Figure 5:
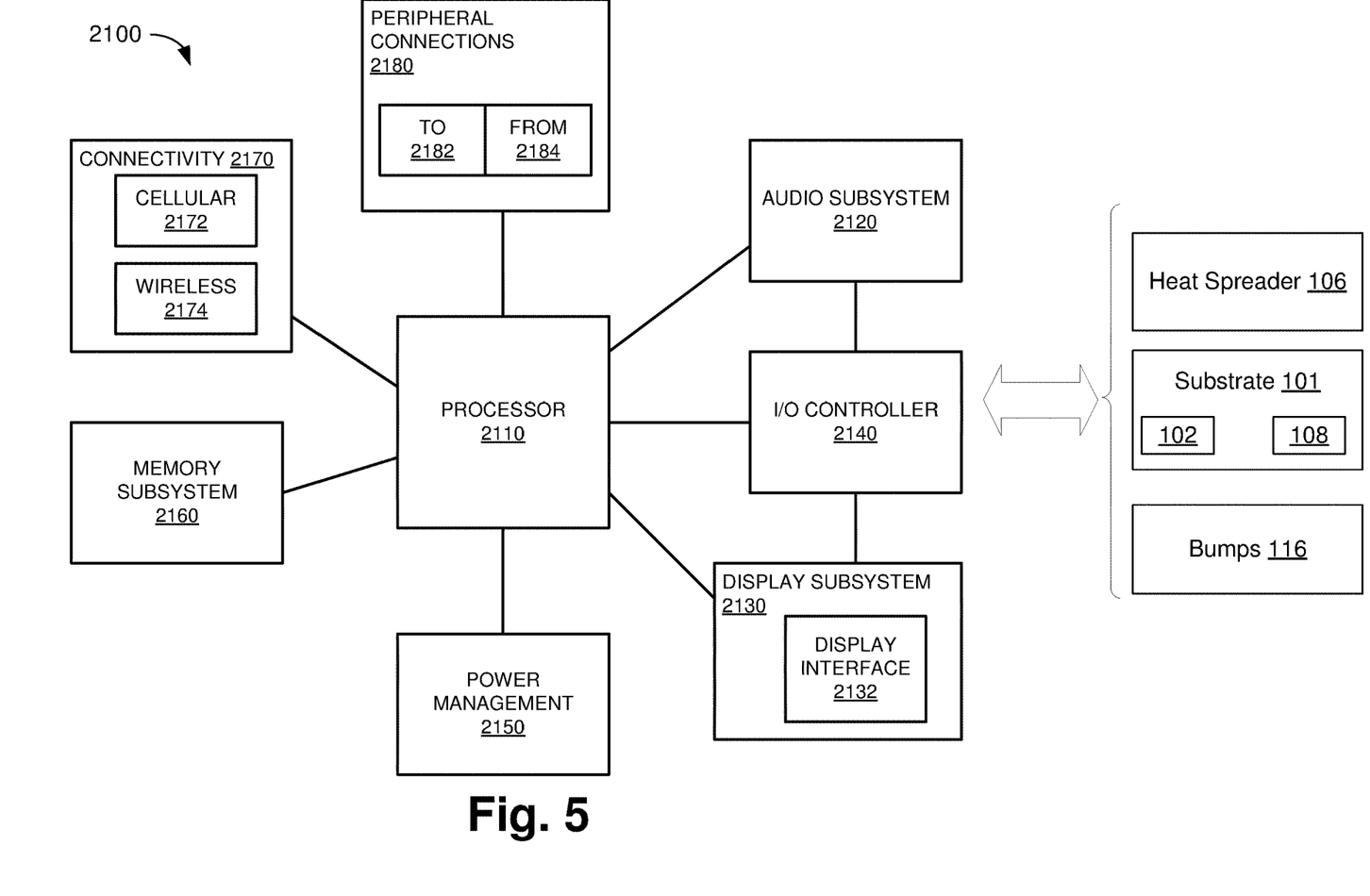
FIG. 5 illustrates a computer system, a computing device or a SoC (System-on-Chip), where one or more components of the computing device are included in one or more dies, where the one or more dies are included in a semiconductor device package, the package including an integrated heat spreader that is coupled to one or more dies and also coupled to a substrate, according to some embodiments.

FIG. 5 illustrates a computer system, a computing device or a SoC (System-on-Chip) 2100, where one or more components of the computing device 2100 are included in one or more dies (e.g., dies 104, 204), where the one or more dies are included in a semiconductor device package (e.g., any of packages 100, 200, 300 of FIGS. 1A-3), the package including an integrated heat spreader (e.g., integrated heat spreader 106) that is coupled to one or more dies and also coupled to a substrate (e.g., substrate 101), according to some embodiments. It is pointed out that those elements of FIG. 5 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, one or more components of the computing device 2100 may be included in one or more IC dies (e.g., dies 104, 204 discussed with respect to FIGS. 1-4). For example, the processor 2110 is included in a first die and a memory of the memory subsystem 2160 is included in a second die. The one or more dies are included in a semiconductor device package (e.g., any of packages 100, 200, 300 of FIGS. 1A-3) of the computing device 2100. The package may include an integrated heat spreader (e.g., integrated heat spreader 106) that is coupled to one or more dies and also coupled to the substrate 101 (e.g., coupled to the thermally conductive layer 108 of the substrate 101). The heat spreader may be coupled to one or more dies by the layer 108 and the one or more components 116 (e.g., which may be thermal bumps), as discussed herein with respect to FIGS. 1-4.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

A semiconductor device package structure comprising: a substrate comprising a first layer over a second layer, the first layer having greater thermal conductivity than the second layer; one or more dies coupled to the substrate; and a heat spreader with a first section coupled to a surface of a first die of the one or more dies, and a second section of the heat spreader coupled to the first layer.

Example 2

The semiconductor device package structure of example 1 or any other example, wherein the surface of the first die is a first surface, and wherein: the first die has: a second surface facing the substrate, and the first surface facing the first section of the heat spreader, the first surface being opposite the second surface, wherein at least a section of the second surface of the first die is coupled to the first layer.

Example 3

The semiconductor device package structure of example 2 or any other example, further comprising: a bump between the second surface of the first die and the first layer, wherein the bump comprises thermally conductive material having greater thermal conductivity than the second layer.

Example 4

The semiconductor device package structure of example 3 or any other example, wherein the first layer and the bump are electrically floating or electrically grounded.

Example 5

The semiconductor device package structure of example 1 or any other example, further comprising: one or more interconnect structures that pass through an opening in the first layer, the one or more interconnect structures to electrically couple the one or more dies to a third layer of the substrate.

Example 6

The semiconductor device package structure of example 1 or any other example, wherein the first layer comprises metal, and the second layer comprises a dielectric material.

Example 7

The semiconductor device package structure of example 1 or any other example, wherein the one or more dies comprise: the first die and a second die in a stack over the substrate, with the second die between the substrate and the first die, wherein the second die has: a first surface facing the first die, and a second surface facing the substrate, the first surface being opposite the second surface, and wherein at least a section of the second surface of the second die is coupled to the first layer by a bump, wherein the first layer and the bump are electrically floating or electrically grounded.

Example 8

The semiconductor device package structure of example 7 or any other example, wherein: the first surface of the second die is coupled to the heat spreader by a dielectric material.

Example 9

The semiconductor device package structure of example 1 or any other example, wherein the one or more dies comprises: the first die coupled to the substrate by a first interconnect structure; and a second die coupled to the substrate by a second interconnect structure, wherein the heat spreader comprises a third section coupled to a first surface of the second die, and wherein a second surface of the second die is coupled to the first layer by a bump.

Example 10

The semiconductor device package structure of example 1 or any other example, wherein the first section of the heat spreader is coupled to the first surface of the first die by material having thermal conductivity higher than the second layer.

Example 11

The semiconductor device package structure of example 1 or any other example, wherein the second section of the heat spreader is coupled to the first layer by thermally conductive adhesive material.

Example 12

The semiconductor device package structure of example 1 or any other example, wherein the second section of the heat spreader is coupled to the first layer through a solder material.

Example 13

The semiconductor device package structure of example 1 or any other example, wherein the first layer is a top layer of the substrate, and is over the second layer.

Example 14

The semiconductor device package structure of example 1 or any other example, wherein: the one or more dies are electrically coupled to a third layer of the substrate by an array of interconnect structures; and the first layer is adjacent to two or more sides of the array of interconnect structures.

Example 15

The semiconductor device package structure of example 1 or any other example, wherein: the second section of the heat spreader is coupled to the first layer along two or more sides of the one or more dies.

Example 16

A system comprising: a substrate comprising a first layer over a second layer, the first layer having greater thermal conductivity than the second layer; a first die including a memory to store instructions; a second die including a processor to execute the instructions, wherein the first and second dies are coupled to the substrate; a wireless interface to facilitate the processor to communicate with another system; a power supply component to supply power to one or both the first or second dies; and a heat spreader with a first section coupled to a surface of the first die, and a second section coupled to the first layer.

Example 17

The system of example 16 or any other example, wherein: the surface of the first die is a first surface; the first die has: a second surface facing the substrate, and the first surface facing the first section of the heat spreader, the first surface being opposite the second surface; at least a section of the second surface of the first die is coupled to the first layer by a bump; the bump comprises thermally conductive material having greater thermal conductivity than the second layer; and the first layer and the bump are electrically floating or electrically grounded.

Example 18

A method comprising: receiving a substrate comprising a first layer over a second layer, the first layer having greater thermal conductivity than the second layer; stacking a die over the substrate; coupling a first portion of a heat spreader to a surface of the die; and coupling a second portion of the heat spreader to the first layer.

Example 19

The method of example 18 or any other example, wherein the first layer has an opening, and stacking the die over the substrate comprises: forming one or more interconnect structures through the opening in the first layer to electrically couple the die to the substrate.

Example 20

The method of example 18 or any other example, further comprising: coupling the die to the first layer by one or more bumps.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A semiconductor device package structure comprising:
   a substrate comprising a first layer over a second layer, the first layer having greater thermal conductivity than the second layer, wherein a portion of the first layer is laterally surrounding a portion of the second layer;
   a plurality of dies, each of the plurality of dies coupled to the portion of the second layer of the substrate, and each of the plurality of dies laterally adjacent to one another; and
   a heat spreader with a first section coupled to a surface of a first die of the plurality of dies, and a second section of the heat spreader coupled to the first layer.

2. The semiconductor device package structure of claim 1, wherein the surface of the first die is a first surface, and wherein:
   the first die has:
   a second surface facing the substrate, and the first surface facing the first section of the heat spreader, the first surface being opposite the second surface, wherein at least a section of the second surface of the first die is coupled to the first layer.

3. The semiconductor device package structure of claim 2, further comprising:
   a bump between the second surface of the first die and the first layer, wherein the bump comprises thermally conductive material having greater thermal conductivity than the second layer.

4. The semiconductor device package structure of claim 3, wherein the first layer and the bump are electrically floating or electrically grounded.

5. The semiconductor device package structure of claim 1, further comprising:
   one or more interconnect structures that pass through an opening in the first layer, the one or more interconnect structures to electrically couple the plurality of dies to a third layer of the substrate.

6. The semiconductor device package structure of claim 1, wherein the first layer comprises metal, and the second layer comprises a dielectric material.

7. The semiconductor device package structure of claim 1, wherein the plurality of dies comprise:
   the first die and a second die in a stack over the substrate, with the second die between the substrate and the first die, wherein the second die has:
   a first surface facing the first die, and a second surface facing the substrate, the first surface being opposite the second surface, and wherein at least a section of the second surface of the second die is coupled to the first layer by a bump, wherein the first layer and the bump are electrically floating or electrically grounded.

8. The semiconductor device package structure of claim 7, wherein:
   the first surface of the second die is coupled to the heat spreader by a dielectric material.

9. The semiconductor device package structure of claim 1, wherein the plurality of dies comprises:
   the first die coupled to the substrate by a first interconnect structure; and
   a second die coupled to the substrate by a second interconnect structure, wherein the heat spreader comprises a third section coupled to a first surface of the second die, and wherein a second surface of the second die is further coupled to the first layer by a bump.

10. The semiconductor device package structure of claim 1, wherein the first section of the heat spreader is coupled to the first surface of the first die by material having thermal conductivity higher than the second layer.

11. The semiconductor device package structure of claim 1, wherein the second section of the heat spreader is coupled to the first layer by thermally conductive adhesive material.

12. The semiconductor device package structure of claim 1, wherein the second section of the heat spreader is coupled to the first layer through a solder material.

13. The semiconductor device package structure of claim 1, wherein the first layer is a top layer of the substrate, and is over the second layer.

14. The semiconductor device package structure of claim 1, wherein:
   the plurality of dies are electrically coupled to a third layer of the substrate by an array of interconnect structures; and
   the first layer is adjacent to two or more sides of the array of interconnect structures.

15. The semiconductor device package structure of claim 1, wherein:
the second section of the heat spreader is coupled to the first layer along two or more sides of the plurality of dies.

16. A system comprising:
   a substrate comprising a first layer over a second layer, the first layer having greater thermal conductivity than the second layer, wherein a portion of the first layer is laterally surrounding a portion of the second layer;
   a first die including a memory to store instructions;
   a second die including a processor to execute the instructions, wherein the first and second dies are coupled to the portion of the second layer of the substrate, and the first and second dies are laterally adjacent to one another;
   a wireless interface to facilitate the processor to communicate with another system;
   a power supply component to supply power to one or both the first or second dies; and
   a heat spreader with a first section coupled to a surface of the first die, and a second section coupled to the first layer.

17. The system of claim 16, wherein: the surface of the first die is a first surface;
the first die has:
   a second surface facing the substrate, and the first surface facing the first section of the heat spreader, the first surface being opposite the second surface;
   at least a section of the second surface of the first die is coupled to the first layer by a bump; the bump comprises thermally conductive material having greater thermal conductivity than the second layer; and
   the first layer and the bump are electrically floating or electrically grounded.

* * * * *